(12) United States Patent
Chung

(10) Patent No.: US 6,406,988 B1
(45) Date of Patent: Jun. 18, 2002

(54) METHOD OF FORMING FINE PITCH INTERCONNECTIONS EMPLOYING MAGNETIC MASKS

(75) Inventor: Kevin Kwong-Tai Chung, Princeton Township, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 0 days.

(21) Appl. No.: 09/190,837

(22) Filed: Nov. 12, 1998

Related U.S. Application Data

(60) Provisional application No. 60/082,886, filed on Apr. 24, 1998, and provisional application No. 60/091,332, filed on Jun. 30, 1998.

(51) Int. Cl.[7] ............................................. H01L 21/44
(52) U.S. Cl. ....................... 438/612; 438/613; 438/942; 438/943; 438/945; 438/975
(58) Field of Search ............................ 438/3, 108, 119, 438/612, 613, 942, 943, 945, 975

(56) References Cited

U.S. PATENT DOCUMENTS

| | | |
|---|---|---|
| 2,014,524 A | 9/1935 | Franz |
| 2,774,747 A | 12/1956 | Wolfson et al. |
| 3,401,126 A | 9/1968 | Miller et al. |
| 3,429,040 A | 2/1969 | Miller |
| 4,113,981 A | 9/1978 | Fujita et al. |
| 4,442,966 A | 4/1984 | Jourdain et al. |
| 4,963,921 A * | 10/1990 | Kariya et al. .................. 355/53 |
| 5,046,415 A | 9/1991 | Oates |
| 5,074,947 A | 12/1991 | Estes et al. |
| 5,196,371 A | 3/1993 | Kulesza et al. |
| 5,237,130 A | 8/1993 | Kulesza et al. |
| 5,476,039 A * | 12/1995 | Hiruta et al. ................ 101/123 |
| 5,539,153 A | 7/1996 | Schwiebert et al. |
| 5,611,140 A | 3/1997 | Kulesza et al. |
| 5,667,884 A | 9/1997 | Bolger |
| 5,851,644 A * | 12/1998 | McArdle et al. ............. 428/213 |
| 5,872,051 A * | 2/1999 | Fallon et al. ................ 438/616 |
| 5,879,761 A | 3/1999 | Kulesza |
| 5,950,908 A * | 9/1999 | Fujino et al. ............. 228/248.1 |

OTHER PUBLICATIONS

Plastics Technical Reference Library [online]. The Sabreen Group, Inc., [retrieved on 2001-10-09]. Retrieved from the Internet: <URL: www.sabreen.com/surface_energies_of_polymers.html>.*

(List continued on next page.)

*Primary Examiner*—Carl Whitehead, Jr.
*Assistant Examiner*—Christy Novacek
(74) *Attorney, Agent, or Firm*—Dann, Dorfman, Herrell and Skillman, P.C.

(57) ABSTRACT

In the construction of electronic devices with one or more flip chips and, in some cases, one or more leadless components, mounted on a substrate, the interconnections are made with conductive adhesive deposited using specialized masks. A magnetic metal mask fabricated of a membrane of magnetic material is placed temporarily onto the face of a semiconductor wafer or of a circuit or other substrate. When properly positioned with respect to the wafer or substrate, such as by relational guide holes, the mask is held in place by the magnetic forces produced by a controllable electromagnet. Contact pad openings in the magnetic metal mask are formed by suitable means such as laser cutting or photo-etching. The magnetic metal mask may include a flexible interface layer on the side facing the wafer or substrate to assure tight sealing thereto, so as to reduce smearing and bridging of the conductive adhesive paste and avoid bridging between contact pads that might otherwise occur during deposition of the paste. Magnetic metal masks may be utilized for depositing various types of adhesives including both solder pastes and conductive and non-conductive polymer adhesives, on semiconductor devices, other electronic components, substrates for electronic devices and printed wiring circuit boards.

36 Claims, 2 Drawing Sheets

OTHER PUBLICATIONS

P. Scharf, T. Coleman and K. Avellar, "Flip Component Technology", IEEE Electronic Component Conference (1967), pp. 269–274.

Gilleo, K: "Direct Chip Interconnect Using Polymer Bonding", IEEE 39th Electronic Component Conference, May, 1989, pp. 37–44.

R. Lachance, H. Lavoie, A Montanari, "Corrosion/Migration Study of Flip Chip Underfill and Ceramic Overcoating", IEEE Electronic Components and Technology Conference (1997), pp. 885–889.

T.Y. Wu, Y. Tsukada, W.T. Chen, "Materials and Mechanics Issues in Flip–Chip Organic Packaging", IEEE Electronic Components and Technology Conference (1996), pp. 524–534.

B. Rösner, J. Liu, Z. Lai, "Flip Chip Bonding Using Isotopically Conductive Adhesives", Electronic Components and Technology Conference, (1996), pp. 578–581.

D. Gamota, C. Melton, "Advanced Encapsulant Materials Systems for Flip Chip", Advancing Microelectronics (Jul./Aug. 1997) pp. 22–24.

R.W. Johnson, D. Price, D. Maslyk, M. Palmer, S. Wentworth, C. Ellis, "Adhesive Based Flip Chip Technology for Assembly on Polyimide Flex Substrates", IEEE International Conference on Multichip Modules, 1997. pp. 81–86.

L. Schaper, K. Maner, S. Ang, "Reliability of Large Conductive Polymer Flip Chip Assemblies for Multichip Modules (MCMs)", IEEE International Conference on Multichip Modules (1997), pp. 87–91.

Dr. V. Ozguz, R. DeLosReyes, Dr. K. Chung, Dr. J. Licari, "Flexible Conductive Adhesive Bumps for Chip Scale Packaging", The Technical Conference At Chip Scale International, May 1998, pp. 15–19.

K. Chung, V. Ozguz, "Flexible Conductive Adhesive as Solder Replacement in Flip Chip Interconnection", Jul. 1998, pp. 1–14.

"Cost Effective Solutions for Advanced Semiconductor Interconnection and Packaging", AI Technology, Inc., Jul. 1998.

Product Catalog No. 500, "Magnetool Electromagnets", Magnetool, Inc., pp. 1, 5–7, 12.

* cited by examiner

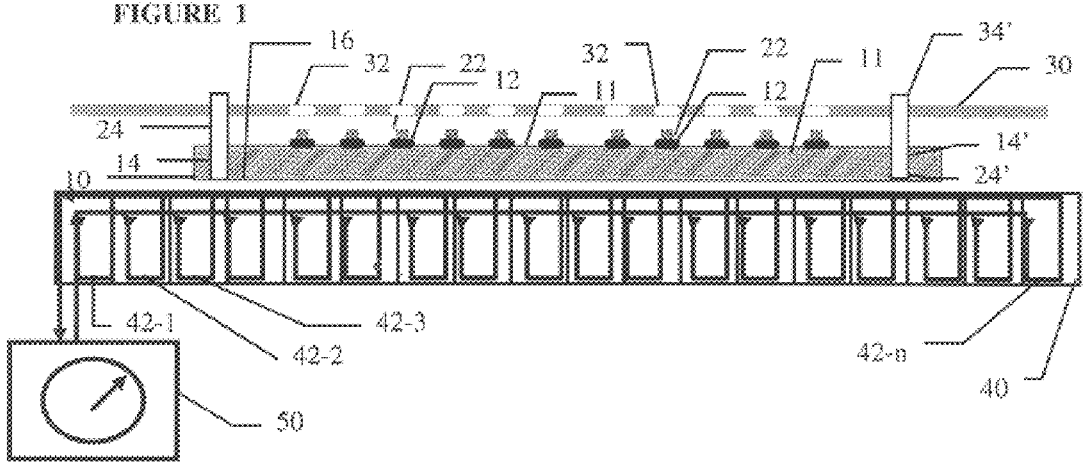
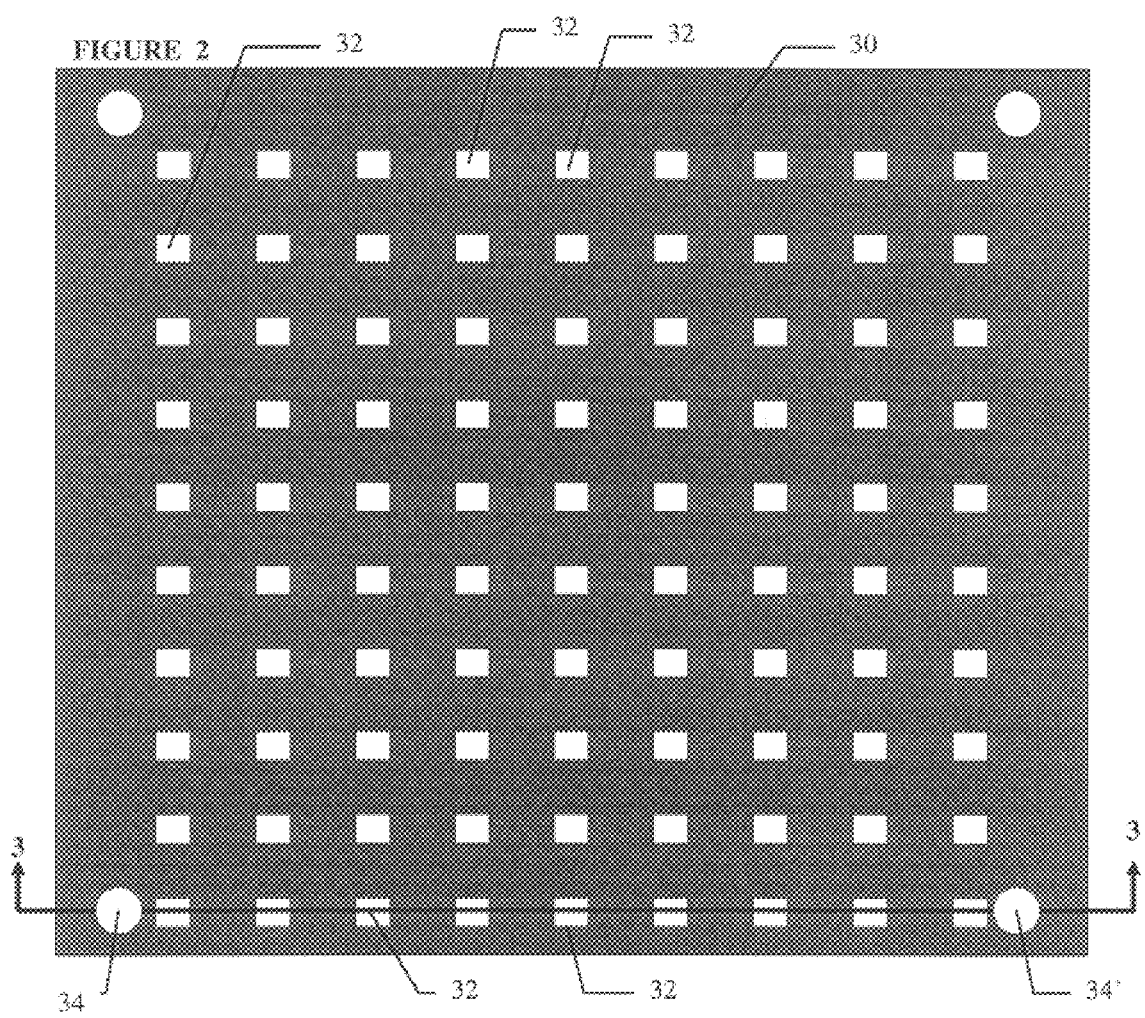

METHOD OF FORMING FINE PITCH INTERCONNECTIONS EMPLOYING MAGNETIC MASKS

This Application claims the benefit of U.S. Provisional Application Serial No. 60/082,886 filed Apr. 24, 1998 and of U.S. Provisional Application Serial No. 60/091,332 filed Jun. 30, 1998.

The present invention relates to fine pitch interconnections and, in particular, to a method for forming fine pitch interconnection materials employing a magnetic mask.

Flip chip semiconductor devices and other leadless electronic components that require fine-pitch interconnections (the "pitch" being the center-to-center spacing of adjacent contacts and/or connections and/or features) are becoming more and more important for the more advanced electronic devices because the reduction in physical size that they afford can accommodate the ever-increasing need for more input and output connections and increasing operating frequencies utilized in modern computers and communication equipment. Thus, the ability to deposit interconnection materials such as solder pastes and conductive adhesives at decreasing pitch is becoming more and more desirable.

Stenciling and screening techniques have been employed for depositing solder pastes and conductive polymers have been around and used for more than 60 years, as exemplified U.S. Pat. No. 2,014,524 issued to Franz in 1935. The same basic technique has recently been extended to high precision by employing photo-etching and laser-cutting techniques for forming very small openings.

While some experiments may have employed stenciling and screening techniques to deposit materials with spacing in the range of 50 microns, in actual practice it is difficult to consistently achieve a pitch of about 100 microns. A precise, repeatable, and consistent method is needed to deposit interconnection materials at fine pitch and at low cost, and to do so over a large area as is present on a 6" or 8" diameter semiconductor wafer. Each deposit of interconnection material, be it a solder paste or a conductive polymer adhesive, is often referred to as a "bump" as in, for example, a "solder bump" or an "adhesive bump."

U.S. Pat. No. 5,539,153 issued to Schwiebert et al. describes a method of stenciling solder bumps onto a substrate wherein the solder is applied through a stencil/mask and paste method. In the embodiment of FIG. 5, Schwiebert et al employ high temperature AlNiCo permanent magnets placed on the side of the substrate opposite the mask to hold the mask, which is of a ferrous material, against the substrate, thus eliminating the need for frame to hold a stencil. Permanent magnets can be placed on both sides of the mask/substrate sandwich if more attachment force is necessary. Alignment of the mask to the wafer may be accomplished manually using a microscope and tapping the wafer with respect to the mask while aligning the apertures and pads. Alternatively, alignment may be accomplished by using tooling pins and corresponding holes. Automated alignment may be accomplished by using tooling pins or fiducials and a vision system.

The permanent magnets of Schwiebert et al. have dramatic ramifications upon aligning and securing the mask in relation to the substrate and particularly upon separating the mask from the substrate after the deposition of the solder paste material. Alignment of mask to the substrate by the manual method is difficult at best with tapping essentially being a "trial and error" method. Moreover, this method is inherently rough and is impractical for attaining precision alignment, e.g., in the range of less than about 300 micron.

The most severe and intractable problems with the Schwiebert et al. use of permanent magnets are the distortion and/or movement of the mask that occurs during placement of the permanent magnets and, once the mask is held down by the permanent magnets, the smearing of the deposited paste bumps during removal of the permanent magnets and separation of the mask.

In the method of Schwiebert et al. the mask and permanent magnets remain with the substrate until after the solder paste bumps deposited onto the substrate are heated to the melting temperature of the solder paste (e.g., 210–230° C., or even as high as 300° C.) so as to reflow and attach permanently onto the contact pads before the mask is separated.

The mask of Schwiebert et al. has two purposes: Firstly, to provide a reservoir to control the volume of paste to be deposited, and secondly to act as a dam or otherwise to contain the paste until, and during, the solder reflow process. The solder paste is applied through a stencil/mask and paste method; however, according to Schwiebert et al., the mask cannot be removed without also removing the solder paste (for pitches less than 400 microns) and so must remain in position on the substrate during the solder reflow process. As a result, the mask material must be carefully chosen from the limited number of materials that (1) have a coefficient of thermal expansion that closely matches that of the substrate over a wide range of temperatures, including the high melting temperature of the solder, and (2) are not wettable by the solder paste. In addition, the support structure that holds the mask in position on the substrate must not impose a strain on the mask or the substrate. High temperature permanent magnets are used on one or both sides of the substrate to attach the mask thereto for the purpose of forming a dam for the solder during the solder reflow process.

While Schwiebert et al. mention the use of tooling pins and corresponding holes for alignment, there is no description of the use thereof, and the alignment of the mask and substrate is apparently only approximate in view of the disclosed range of pitches which is limited 150 to 350 microns. Moreover, with the use of permanent magnets, the alignment will easily be disturbed during the placement of the permanent magnet to hold the mask in position after it is aligned with the substrate, apparently then being "tapped" into final position. This tapping-in-place process is an inherent problem with the use of permanent magnets and is impractical and/or very costly for the fine spacing and fine pitch, e.g., under 250 microns, of current and future requirements for the deposition of conductive adhesives and even solder paste. In addition, the relative movement of the mask and substrate when they are pressed together under the force of the permanent magnets may introduce minute damage sites onto the substrate that could decrease its reliability or performance.

U.S. Pat. No. 5,046,415 to Oates describes a composite stencil that includes a layer of metallic material such as brass and a layer of flexible material bonded to the metallic layer for the screen printing of solder paste. While the flexible layer of Oates is also used to provide a dam for the solder paste, there is no suggestion that it be held in place with magnets or that it withstand the high temperature of the solder reflow. One of the most difficult aspects of depositing adhesive paste onto a semiconductor wafer is the fact that extremely small amounts of adhesive paste must be deposited onto a multiplicity of very small, e.g., 50–100 microns, contact pads that are situated on a large circular wafer structure, e.g., 6 inches or more in diameter. Alignment of such masks and wafers can generally be achieved only with high precision equipment and a relatively expensive process.

Accordingly, there is a need for an accurate, reliable, repeatable and low cost method of depositing conductive pastes at very fine feature sizes and pitches onto large substrates including the accurate alignment and holding of the mask in position with respect to the substrate. It is also desirable that such method accommodate masks formed of ferromagnetic and similar materials that have a high magnetic attraction to allow fast and accurate deposition of paste adhesives.

To this end, the present invention comprises a method for forming a pattern of adhesive on a substrate comprising:

obtaining a substrate having a pattern of sites thereon on which adhesive is to be deposited;

obtaining a magnetic mask having a pattern of apertures corresponding to the pattern of sites;

positioning the substrate and the magnetic mask proximate each other so that the pattern of sites and the pattern of apertures correspond;

controllably energizing an electromagnet to generate a magnetic field to hold the magnetic mask and the substrate in close contact;

applying adhesive to substantially fill the apertures of the magnetic mask;

controllably de-energizing the electromagnet; and removing the magnetic mask to leave the adhesive on the pattern of sites.

A magnetic mask according to the present invention comprises a thin metal membrane and a layer of compressible material having a surface energy less than about 50 dyne-cm formed on at least one side of the thin metal membrane. One of the thin metal membrane and the compressible material has ferromagnetic properties, and the magnetic mask has a pattern of apertures.

BRIEF DESCRIPTION OF THE DRAWING

The detailed description of the preferred embodiments of the present invention will be more easily and better understood when read in conjunction with the FIGURES of the Drawing which include:

FIG. 1 is a sectional diagram of an exemplary embodiment of a magnetic mask, substrate and electromagnet suitable for practicing the present invention;

FIG. 2 is a plan view of an exemplary magnetic mask of the sort shown in FIG. 1;

DESCRIPTION OF THE PREFERRED EMBODIMENTS

Figure 3:
FIG. 3 is a cross-sectional view of the magnetic mask of FIG. 2.

In the present invention, as exemplified in FIG. 1, fine pitch bumps 22 of a conductive paste, such as a conductive polymer adhesive or a solder paste, are deposited onto a substrate 10 by a method employing a magnetic mask 30 that is held in position on the substrate by the force of the magnetic field generated by an electromagnet 40. A "magnetizable mask" or a "magnetic mask" is a mask that has ferromagnetic properties or high magnetic permeability so that it is attracted by a magnetic field. Such mask may be formed of a thin sheet of a ferromagnetic metal such as iron, iron alloy, steel, carbon steel, magnetic stainless steel, nickel alloy, or alloys thereof, or by non-magnetic or para-magnetic materials such as polymers, polymeric films and plastics that are filled with fine particles having ferromagnetic properties or of thin sheets of non-ferrous metals such as brass, copper, or non-magnetic stainless steel and the like that are not ferromagnetic themselves, but are coated with a material that has ferromagnetic properties, as will be described herein below, generally without regard to the coefficient of thermal expansion of the mask material. Any mask 30 that can be held firmly against substrate 10 by the magnetic field generated by energizing electromagnet 40 can be employed in the present invention.

With electromagnet 40, the inherent problems of distortion and minor movement of the mask as the permanent magnets are moved into position after the alignment of the mask and substrate is overcome. The electromagnet 40 is energized, preferably gradually, by a controllable current source 50 to build up the magnetic field strength gradually and uniformly by controlling the magnitude of the electrical current flowing through the coils 42-1, 42-2, 42-3, . . . , 42-n of electromagnet 40, and is similarly de-energized, preferably gradually, by controllable current source 50. This method has been employed to deposit features (e.g., bumps) of conductive adhesive at a 75 micron pitch.

In the present method, a substrate 10 having a surface 11 on which a pattern of features formed of conductive paste is to be deposited is obtained. The substrate 10 has at least two relational alignment holes 14, 14' that are precisely located in known predetermined relationship to the pattern of features to be formed on surface 11. Such features usually correspond to a pattern of contact pads 12 on surface 11 of substrate 10 for making electrical connections to electrical circuits. Where substrate 10 is a semiconductor wafer, the contact pads 12 connect to integrated circuits or other semiconductor elements that are usually formed in substrate 10. For semiconductor wafers where a multiplicity of individual like circuits are formed on one wafer, multiple repetitions of the same pattern of apertures 32 are made on the magnetic mask 30, such as by laser cutting, to facilitate alignment and subsequent deposition of conductive adhesive in volume onto all the individual circuits in a single deposition operation. Where substrate 10 is a printed wiring circuit board, the contact pads 12 are portions of electrical conductors of copper or other conductive metal that are usually formed on surface 11 of substrate 10 and to which electrical components, such as resistors, capacitors, inductors, transformers, relays, diodes, transistors, integrated circuits, connectors, wires and the like, are to be connected.

Magnetic mask 30 is positioned proximate surface 11 of substrate 10 such that the pattern of apertures 32 therein, which pattern corresponds to the pattern of contact pads 12 on substrate 10 onto which conductive paste is to be deposited, exactly overlies the pattern of corresponding contact pads 12 on substrate 10. Alignment of the patterns of magnetic mask 30 and substrate 10 can be performed easily with optical and mechanical means including relational alignment holes and alignment pins in conjunction with electromagnet 40. Magnetic mask 30 further includes at least two relational alignment holes 34, 34' that are precisely located with respect to the pattern of apertures in magnetic mask 30 in the same known predetermined relationship as are the relational alignment holes 14, 14' to the pattern of features to be formed on surface 11. As a result, when relational alignment holes 34, 34' of magnetic mask 30 exactly overlie the corresponding relational alignment holes 14, 14', respectively, in substrate 10, then the pattern of apertures 32 of magnetic mask 30 are positioned exactly over the pattern of contact pads 12 on surface 11 of substrate 10. Magnetic mask 30 and substrate 10 are maintained in this precise positional relationship by at least two precision alignment pins 24, 24', pin 24 being inserted through relational alignment holes 14 and 34 and alignment pin 24' being inserted through relational alignment holes 14' and 34'.

Electromagnet 40 is positioned near the underside surface 16 of substrate 10 and opposite surface 11 thereof. Electromagnet 40 may be moved into position either before or after magnetic mask 30 is positioned over substrate 10, and either before or after alignment pins 24, 24' are inserted. Electromagnet 40 is at least as large in size as the pattern of features to be formed, and is preferably larger than the wafer or substrate 10 with which it is used. When energized, electromagnet 40 produces a relatively uniform magnetic field over an area that is at least as large as the patterns of apertures 32 in magnetic mask 30 and of contact pads 12 on substrate 10. Electromagnet 40 is controllably energized by direct current from controllable source 50 flowing through the coils 42-1, 42-2, 42-3 through 42-n to produce a relatively uniform magnetic field that attracts magnetic mask 30 thereby causing magnetic mask 30 to be pulled into and held in close or intimate contact with surface 11 over substantially the entire area of substrate 10. Controllable source 50 preferably provides a controllable direct current that is low in electrical noise. The strength of the magnetic field produced by electromagnet 40 may be increased gradually, for example, over a time period of 1–10 seconds, so as not to cause any significant stress in or movement of magnetic mask 30. In some instances it may be desirable to cause a small current, e.g., about 5%–20% of full current, to flow through electromagnet 40 after magnetic mask 30 is placed on surface 11 of substrate 12, but before it is aligned thereon by the insertion of alignment pins 24, 24' into relational alignment holes 14, 14', 34, 34', so as to conform magnetic mask 30 to surface 11 and to remove distortions in magnetic mask 30. At full current, electromagnet 40 pulls magnetic mask 30 into contact with substrate 10 at a pressure of about 10 psi, typically with a gap of about 500 microns between electromagnet 40 and magnetic mask 30.

Electromagnet 40 preferably has a plurality of electrical coils of wire arrayed in a plane parallel to the plane of the surface that is proximate substrate 10 and magnetic mask 30 so as to develop a magnetic field substantially perpendicular to its surface. It is desired that the magnetic field be substantially uniform over the area of magnetic mask 30 over which material is to be deposited so that magnetic mask 30 is substantially uniformly pressed against substrate 10 over the deposition area. Suitable electromagnets include model #EMP 2 Series Electromagnets, such as model EMP 2-6-110, commercially available from Magnetool Inc. of Troy, Mich., and suitable controllable sources include model MRVP Rectifier-Controllers also available from Magnetool Inc., however, a 500 $\mu$F capacitor is connected across the output terminals of a model MR-100-150-VP Rectifier-Controller.

Conductive paste is applied over the top of magnetic mask 30 by conventional techniques such as a roller, squeegee or spraying, to fill the apertures 32 in magnetic mask 30. Because magnetic mask 30 is held tightly and uniformly against substrate 10 by the relatively uniform magnetic field produced by electromagnet 40, the conductive paste fills and is confined within apertures 32, thereby to contact the contact pads 12, and is prevented from flowing between magnetic mask 30 and substrate 10. The current flowing through electromagnet 40 is then gradually reduced to zero to release magnetic mask 30 from substrate 10 in a controlled manner, and magnetic mask 30 is then removed leaving behind on the pattern of contact pads 12 of substrate 10 a corresponding pattern of conductive bumps 22 formed of the conductive adhesive that was applied to fill the apertures 32 of magnetic mask 30.

Following deposition of a paste or sprayable conductive adhesive or of a solder paste, magnetic mask 30 is preferably immediately separated from the substrate 10. By separating magnetic mask 30 from substrate 10 before any subsequent processing, such as B-staging or drying of a paste adhesive, the bumps or dots of adhesive will not become attached onto magnetic mask 30 and the integrity and uniformity of the conductive adhesive bumps 22 will be preserved. In addition, the conductive adhesive paste selected for such precision deposition has sufficient molecular weight to prevent its movement to the sites of neighboring contact pads 12 after removal of magnetic mask 30 from substrate 10.

The conductive adhesive is then appropriately cured in the conventional manner, such as by drying for solvent-based adhesives, B-staging for epoxy-based adhesives, heating for thermoplastic adhesives, or heating to a solder reflow temperature for solder pastes. In the case of a semiconductor wafer, the wafer is then ready for scribing and dicing into individual dies, each of which has a pattern of conductive adhesive on its contact pads. The completed substrates may be used immediately or may be stored for a substantial period of time before use.

The foregoing alignment and deposition method allows high volume and low cost deposition of the conductive paste onto large substrates to form patterns of many fine features at fine pitch thereon. It is estimated that this method will allow patterns of features or bumps to be deposited at a cost of less than U.S. $30 per 6-inch semiconductor wafer, or about $0.03 per chip if 1000 chips are fabricated on one wafer. This is dramatically less than the lowest cost conventional method for forming patterns of bumps of solder paste on flip-chip devices formed on a semiconductor wafer, which conventional method cannot achieve the fine features or the fine pitch of the method of the present invention.

FIG. 2 is a plan view of an exemplary magnetic mask 30 as employed in the method described herein. Magnetic mask 30 has a plurality of apertures 32 arranged in a pattern to correspond to the contact pads 12 of a substrate 10 onto which conductive adhesive is to be deposited and at least two relational alignment holes 34, 34'. The shape of magnetic mask 30 may conveniently follow the shape of the substrate 10 with which it will be employed, although it need not, however, it is preferred that the mask be substantially larger than the substrate. For example, if a magnetic mask 30 is to be employed with a 6-inch diameter circular semiconductor wafer, then it is convenient for magnetic mask 30 to be circular with a diameter greater than about 6 inches. Similarly, if magnetic mask 30 is to be employed with a rectangular printed wiring circuit board, then it will generally be convenient for magnetic mask 30 to be rectangular with approximately the same or greater dimensions than the circuit board.

Magnetic mask 30 may be fabricated by at least three methods that are capable of producing from thin metal membranes masks with suitable resolution to produce fine features at fine pitch over areas as large as a semiconductor wafer. It is noted that both the dimension of the opening or feature as well as the tolerance in its physical location, both absolutely and in relation to other openings and features is of importance in fabricating magnetic mask 30. In general, the fabrication method producing the finest feature dimension will ordinarily also produce the lowest tolerance dimension associated with physical position over the area of the mask.

The lowest cost method for fabricating magnetic mask 30 is conventional photo-etching of the sort commonly employed for fabricating thick film circuits and depositing solder paste. In this method, a photosensitive layer is first deposited onto a thin metal membrane, such as brass or stainless steel membrane, and is then exposed. A pattern of openings corresponding to the pattern of apertures 32 is made in the photosensitive layer by areas thereof which are left unexposed and are then washed away by a solvent to expose the metal underneath, leaving the rest of the metal membrane protected by the cross-linked polymer of the exposed photosensitive layer. An acid or other etching chemical is applied to etch away those areas of exposed metal to form openings therethrough in the pattern of apertures 32. The current state of photo-etching technology is able to produce a pattern of 125-micron openings in metal sheets having a thickness of 50 microns or more.

A second method of fabricating magnetic mask 30 that is cost effective employs laser machining. A beam produced by a high power laser having a fine beam focus is used to heat up those areas of the metal membrane at which openings corresponding to the pattern of apertures 32 are to be made and the energy of the laser beam vaporizes or evaporates away the metal to form openings in the metal membrane. The energy level of the laser beam is selected to be sufficient to vaporize the material to be removed in a controlled fashion, but is not so high as to damage surrounding areas of the material, be that the metal membrane of magnetic mask 30 or the material of substrate 10. Laser machining technology is advancing and can currently machine openings and other features having dimensions of less than 10 microns, but at higher cost than that of photo-etching. The most precise openings and the finest features may be achieved by a third method known as electroforming. In this technique, the same photo-resist materials that are used in conventional semiconductor wafer processing are used to form the fine openings and features, and electroplating is used to build up a thin metal foil. Precision openings having a dimension as fine as 2.5 microns have been fabricated by electroforming. Other methods, such as screen emulsion and die cutting, may also be employed. Combinations of two or three of the foregoing techniques may be employed for better cost effectiveness, such as where both fine and larger openings and features are to be formed in the same metal membrane.

One important feature of the preferred embodiment of magnetic mask 30 is the provision of at least two relational alignment holes 34, 34' therein that are precisely located in respective known predetermined positions with respect to the pattern of apertures 32, and therefore with respect to the pattern of contact pads 12 of substrate 10. The relational alignment holes are located near the outer edge(s) of magnetic mask 30 which correspond, for example, to the outer areas of a semiconductor wafer substrate 10 where semiconductor circuits are not formed thereon, or to the four corners of a rectangular printed wiring circuit board substrate 10 where components are not mounted thereon. In a typical case, four relational alignment holes 34, 34' may be made. Preferred methods to drill the at least two relational alignment holes 34, 34' include laser machining as described above or other suitable means that will achieve appropriate tolerances for both the size, e.g., diameter, and position of the relational alignment holes. The same method is employed to drill relational alignment holes 14, 14' on substrate 10 in the same known predetermined positional relationship to the contact pads 12 of substrate 10 as is employed to position the relational alignment holes 34, 34' of magnetic mask 30. Relational alignment holes 34, 34' may be any size suitable for receiving precision mechanical alignment pins 24, 24' to be inserted therein. Alignment pins 24, 24' having a diameter of approximately 0.025 inch or larger have been found to be satisfactory. For printed wiring circuit board substrates 10 fabricated of materials such as FR4 fiberglass laminates, conventional precision drilling may provide sufficient precision for relational alignment holes 14, 14'.

FIG. 3 is a cross-sectional diagram of the exemplary magnetic mask 30 of FIGS. 1 and 2 taken at the section line 3–3' of FIG. 2 and in which a pattern of apertures 32 and relational alignment holes 34, 34' are formed in a thin ferromagnetic metal membrane 36. Membrane 36 may be formed, for example, of steel or ferromagnetic stainless steel having a thickness of 50 microns; thicknesses of less than 50 microns are difficult to work with because the reduced strength of the mask makes it susceptible to buckling and/or tearing.

In one exemplary embodiment, magnetic mask 30 is made from a high-iron-content passivated metal film having a thickness of 100 microns. The apertures 32 therein have a diameter of 100 microns and a pitch of 200 microns patterned over the area of a semiconductor wafer having a 6-inch diameter. After the magnetic mask 30 is aligned with the semiconductor wafer 10 using relational alignment holes 14, 14', 34, 34'. electromagnet 40 is energized to hold magnetic mask 30 in proper positional alignment over and in close or intimate contact with semiconductor wafer 10. Conductive adhesive such as type LTP8150-FP available commercially from AI Technology, Inc. of Princeton, N.J., is roll coated over the entire area of magnetic mask 30 and is thereby flowed into the 100-micron diameter apertures 32 using a ½-inch diameter steel rod having a Teflon® coating. After the conductive adhesive paste has been deposited and the excess adhesive material is removed, electromagnet 40 is turned off to release magnetic mask 30 which is then removed.

The semiconductor wafer substrate 10 with deposited adhesive bumps 22 thereon is then placed in an oven at about 60–80° C. for about 30–60 minutes, at which time the bumps 22 are completely dry to the touch and have a diameter of about 60 microns. Bumps 22 have a cured height of about 50%–90% of their uncured height which is substantially the thickness of magnetic mask 30. To promote additional adhesion of the bumps 22 to contact pads 12, semiconductor wafer 10 may be placed on a hot-plate at about 200–230° C. for 10–30 seconds. Semiconductor wafer 10 is then ready for dicing into individual die, e.g., flip chips, that may be stored at ambient temperature for more than 12 months before being bonded to an electronic device substrate at a temperature in the range of about 200–230° C.

Although it is not necessary for flip chips employing type LTP8150-FP flexible conductive adhesive interconnects to be mounted using an underfill adhesive, it may be desirable to protect the individual die against the effects of high moisture and temperature conditions after they are mounted to an electronic device substrate. This is accomplished by applying a flexible adhesive having a low glass transition temperature Tg, such as adhesive type MEE7650-5 which is also available from AI Technology, between the edges of the flip chip and the electronic device substrate and curing the adhesive at about 150° C. for about 30 minutes. If the bumped chips are to be bonded to an electronic device substrate using an underfill adhesive, the underfill adhesive should be similar in flexibility to adhesive type MEE7650-5. If the assembled electronic device including such flip chip will be exposed to very low temperatures, an adhesive having a correspondingly low glass transition temperature Tg, preferably below −55° C., should be employed.

Figure 4:
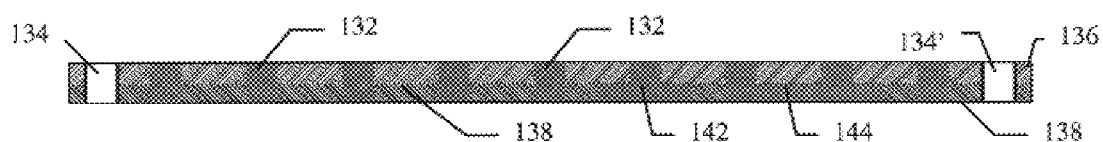
FIG. 4 is a cross-sectional view of an alternative embodiment of the magnetic mask of FIG. 2.

FIG. 4 is a cross-sectional diagram of an exemplary alternative magnetic mask 130 that may be substituted for magnetic mask 30 in FIGS. 1 and 2 and in the method described above. Magnetic mask 130 is a laminate of a very thin metal membrane 136 having high magnetic permeability so as to be attracted by the magnetic field produced by electromagnet 40 and a flexible and compressible cross-linked polymer membrane coating 138 for enhancing the seal between magnetic mask 130 and surface 11 of substrate 10 when in close or intimate contact therewith under the force of electromagnet 40. Flexible compressible interface layer 138 provides sealing against smearing and leaking of the conductive adhesive paste to the sites of neighboring contact pads 12. Relational alignment holes 134, 134' have a known predetermined positional relationship with the pattern of apertures 132 of magnetic mask 130 and of contact pads 12 of the substrate 10 as described above.

In an exemplary embodiment of magnetic mask 130, magnetic metal sheet 136 has a thickness of 50 microns and apertures 132 have a diameter of 50 microns etched in the same pattern as that of the corresponding contact pads 12 of semiconductor wafer substrate 10. Metal membrane 136 is coated with a flexible and compressible coating of type MEE7850 adhesive also available from AI Technology, which is cured to have a thickness of about 25 microns, and which leaves the apertures 132 open and not plugged. Conductive bumps produced by magnetic mask 130, when cured have a diameter of about 75 microns and a height of about 45–50 microns, when formed of type TP8150-FP conductive adhesive.

In another exemplary embodiment of magnetic mask 130, magnetic metal sheet 136 has a thickness of 125 microns, the type ME7850 flexible layer 138 has a cured thickness of about 25 microns, and apertures 132 include square openings of 200×200 microns and rectangular openings of 200×300 microns at a pitch of 250 microns etched in the same pattern as that of the corresponding contact pads 12 of substrate 10. For conductive bumps formed of a B-stageable epoxy type ESS8450 flexible conductive adhesive available from AI Technology, the height of the cured conductive adhesive bumps 22 was about 75 microns, or approximately 60% of the deposited height of 125 microns, after conductive bumps 22 were B-staged and dried in an oven at about 60–80° C. for about 30–60 minutes. Cured bump heights of 50%–100% of the uncured bump height are typical. This substrate 10 with conductive epoxy adhesive bumps 22 thereon may be diced and stored at ambient temperature for more than 12 months before subsequent bonding to an electronic device substrate.

Bumped substrate 10 may be bonded to an electronic device substrate by aligning the conductive bumps 22 with the corresponding contact pads of the next level board, i.e. the electronic device substrate, and curing the assembly at about 150–175° C. under about 10 psi compressive force for approximately 1–5 minutes. If an underfill adhesive is used is assembling bumped substrate 10 onto an electronic device substrate, the underfill adhesive must have similar flexibility to that of the flexible epoxy conductive adhesive, e.g., a modulus of elasticity in the range of 30,000 to 300,000 psi in the present example. While lower modulus of elasticity underfill materials may be used, underfill materials having a modulus of elasticity underfill higher than 300,000 psi may result in excessive shear stress and may cause delamination of the bumped device and the electronic device substrate when exposed to very low temperatures, e.g., −55° C.

Magnetic mask 130 is aligned, held in close or intimate contact with, and removed from substrate 10, and type LTP8150-FP or type ESS8450 flexible conductive adhesive is applied and cured, in accordance with the method described above. Mounting of the bumped substrate 10 to an electronic device substrate is also as described above.

Apertures in compressible layer 138 on the underside of metal membrane 136 may be substantially larger than the corresponding apertures in metal membrane 136, as is aperture 142, and in fact may encompass a plurality of apertures in metal membrane 136, as does aperture 144. Apertures 142, 144 in compressible layer 138 are examples of oversize apertures that may be employed in certain applications, such as with flexible adhesives having a relatively high viscosity as deposited so as not to spread very far under metal membrane 136. With this alternative aperture arrangement, the deposition of flexible adhesive bumps having a slightly greater height and/or diameter is facilitated. For example, with a 2-mil thick metal membrane having 2-mil diameter apertures and a 2-mil thick compressible layer having 50-mil and 100-mil diameter apertures associated with ones of the 2-mil diameter apertures, 2-mil or slightly larger diameter bumps having about a 4-mil height are deposited. More than 50% of the area of the metal membrane 136 over which the pattern of apertures is formed remains covered by compressible layer 138, which compressible layer of the mask is pulled into and held in close or intimate contact with the substrate 10 by the magnetic field of electromagnet 40, for example, under a pressure of about 10 psi.

Figure 5:
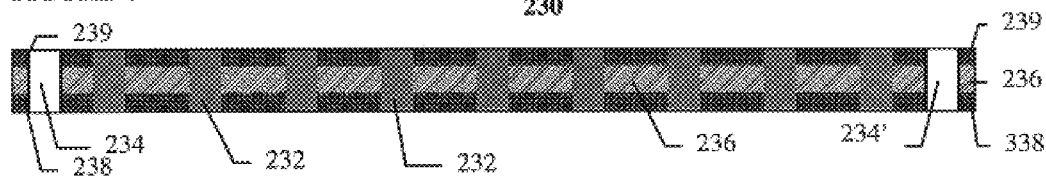
FIG. 5 is a cross-sectional view of an alternative embodiment of the magnetic mask of FIG. 2.

FIG. 5 is a cross-sectional diagram of an exemplary alternative magnetic mask 230 that may be substituted for magnetic mask 30 in FIGS. 1 and 2 and in the method described above. Magnetic mask 230 is a laminate of a very thin metal membrane 236 having high magnetic permeability so as to be attracted by the magnetic field produced by electromagnet 40, a flexible and compressible cross-linked polymer membrane coating 238 on the underside of metal membrane 236 for enhancing the seal between magnetic mask 230 and surface 11 of substrate 10 when in close or intimate contact therewith under the force of electromagnet 40, and a flexible and compressible cross-linked polymer membrane coating 239 on the topside of metal membrane 236 for enhancing the strength and durability thereof. Flexible compressible interface layer 238 provides sealing against smearing and leaking of the conductive adhesive paste to the sites of neighboring contact pads 12 of substrate 10. Relational alignment holes 234, 234' have a known predetermined positional relationship with the pattern of apertures 232 of magnetic mask 230 and of contact pads 12 of the substrate 10 as described above.

In an exemplary embodiment of magnetic mask 230, magnetic stainless steel membrane 236 has a thickness of about 25 microns, flexible layer 238 has a cured thickness of about 50 microns, and flexible layer 239 has a cured thickness of about 50 microns. Flexible layers 238 and 239 are formed of type MEE7850 flexible coating. Magnetic mask 230 is aligned, held in close or intimate contact with, and removed from substrate 10, and type LTP8150-FP flexible conductive adhesive is applied and cured, in accordance with the method described above. Mounting of the bumped substrate 10 to an electronic device substrate is also as described above. The dried bumps of type TP8150-FP conductive adhesive have a finished thickness of about 60–100 microns. It is particularly advantageous for the coating material 239 on the top side of magnetic mask 230 to have relatively low surface tension (or surface energy), for example, in the range of about 20–50 dyne/cm, to facilitate easy removal of excess conductive adhesive during depositing of the conductive adhesive bumps 22 as described above. For example, type MEE7850 material has a surface energy of less than about 40 dyne/cm.

Figure 6:
FIG. 6 is a cross-sectional view of an alternative embodiment of the magnetic mask of FIG. 2.

FIG. 6 is a cross-sectional diagram of another exemplary alternative magnetic mask 330 that may be substituted for magnetic mask 30 in FIGS. 1 and 2 and in the method described above. Magnetic mask 330 is a laminate of a very thin metal membrane 336 that need not have high magnetic permeability so as to be attracted by the magnetic field produced by electromagnet 40, a flexible and compressible cross-linked polymer membrane coating 338 on the underside of metal membrane 336 that is filled with fine particles of a ferromagnetic or other high magnetic permeability material for being attracted by the electromagnetic field produced by electromagnet 40 and for enhancing the seal between magnetic mask 330 and surface 11 of substrate 10 when in close or intimate contact therewith under the force of electromagnet 40, and a flexible and compressible cross-linked polymer membrane coating 339 on the topside of metal membrane 336 for enhancing the strength and durability thereof. Flexible compressible interface layer 338 provides sealing against smearing and leaking of the conductive adhesive paste to the sites of neighboring contact pads 12 of substrate 10. Metal membrane 336 may be formed of non-magnetic stainless steel, brass, or other non-magnetic material. Relational alignment holes 334, 334' have a known predetermined positional relationship with the pattern of apertures 332 of magnetic mask 330 and of contact pads 12 of the substrate 10 as described above.

In an exemplary embodiment of magnetic mask 330 having a thickness of about 125 microns, stainless steel membrane 336 has a thickness of about 25 microns, flexible layer 338 has a cured thickness of about 50 microns, and flexible layer 339 has a cured thickness of about 50 microns. Flexible layers 338 and 339 are formed of type MEE7850 flexible polymer matrix epoxy resin coating. Flexible coating 338 is filled with fine iron filings comprising approximately 20%–50% by volume of the mixed filled resin which provides sufficient magnetic material to produce sufficient attractive force under the magnetic field produced by electromagnet 40 while maintaining adequate flexibility of layer 238. Iron filings smaller than 45 microns in ratio of approximately 2:1 by volume of particle to resin have been found satisfactory. Apertures 332 having diameters of from 50 microns to 250 microns and relational alignment holes 334, 334' are cut in magnetic mask 330 by a high-power laser beam in a pattern to correspond to the contact pads 12 and relational alignment holes 14, 14' of substrate 10.

Magnetic mask 330 is aligned, held in close or intimate contact with, and removed from substrate 10, and type PSS8150 SOLDER-SUB® flexible conductive adhesive, which also is available from AI Technology, is applied and cured, in accordance with the method described above. Mounting of the bumped substrate 10 to an electronic device substrate is also as described above. The dried bumps of type PSS8150 conductive adhesive have a finished thickness of about 60–100 microns. If an adhesive underfill of flip chips produced by the foregoing method is desired, type MEE7850-5 is satisfactory.

Figure 7:
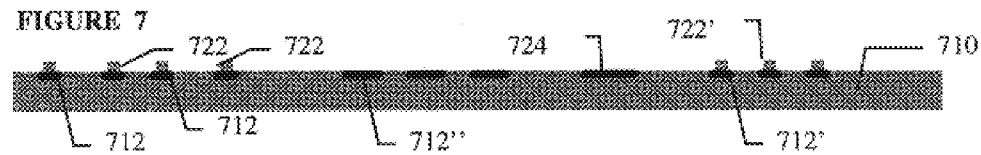
FIG. 7 is a cross-sectional view of an exemplary printed circuit substrate according to the method of the present invention.

FIG. 7 is a cross-sectional view of a printed wiring circuit board 710 having a pattern of contact pads 712, 712', 712" thereon. Two groups of contact pads 712, 712' have bumps of conductive adhesive 722, 722' deposited thereon in accordance with the method employing a magnetic mask as described above, and are ready to receive electrical components not having conductive adhesive on their contact pads thereto. Contact pads 712" do not have conductive adhesive thereon and are ready to receive electrical components that have conductive adhesive bumps deposited on their contact pads in accordance with the method employing a magnetic mask as described above. An area of adhesive 724 is deposited on circuit board 710 in accordance with the method described above, for example, in an area thereof not having a contact pad, for attaching an object to circuit board 710. Thus, circuit board 710 is prepared to receive electronic components and make electrical interconnections and/or mechanical attachments thereto.

Figure 8:
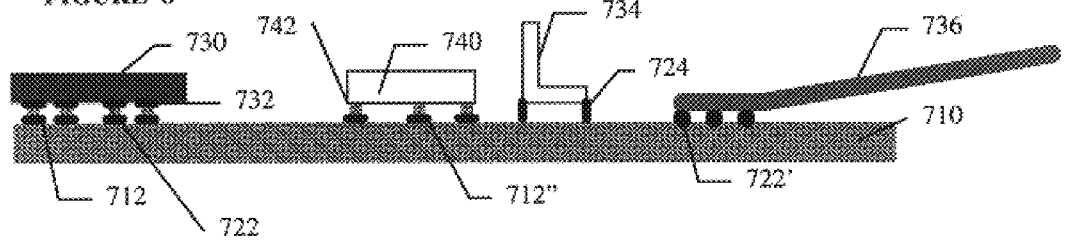
FIG. 8 is a cross-sectional view of an electronic device including the exemplary substrate of FIG. 7.

In FIG. 8, another cross-sectional diagram of printed wiring circuit board 710, electronic components and other objects have been attached to printed wiring circuit board 710 to form an electronic device. Electronic component 730, which may be a semiconductor flip chip device, a resistor, a capacitor, an inductor or other electronic component, has its contact pads interconnected to the corresponding contact pads 712 of circuit board 710 by the conductive adhesive bumps 722 that were deposited onto contact pads 712. A bond wire or connection jumper 736 is electrically connected to contact pads 712' of circuit board 710 by the conductive adhesive bumps 722' that were deposited on contact pads 712'. Electronic component 740, which may be a semiconductor flip chip device, a resistor, a capacitor, an inductor or other electronic component, has its contact pads interconnected to the corresponding contact pads 712" of circuit board 710 by the conductive adhesive bumps 742 that were deposited onto the contact pads of semiconductor flip chip 740. In addition, object 734, which may be a mounting bracket, heat sink, structural stiffener or other object, is attached to circuit board 710 by the adhesive 724 that was deposited on circuit board 710. Electronic components 730, 740, wire 736 and object 734 are heated to about 150° C. and pressed against circuit board 710, which has been heated to about 220° C. with a pressure of about 10 psi to form the polymer adhesive connections that attach such components and objects to circuit board 710.

Accordingly, it is seen that the present invention is useful for depositing patterns of adhesive bumps on substrates of various sizes and materials, and for doing so for very fine features and bumps as well as larger features and bumps.

While the present invention has been described in terms of the foregoing exemplary embodiments, variations within the scope and spirit of the present invention as defined by the claims following will be apparent to those skilled in the art. For example, while the embodiments described above describe forming bumps of various conductive polymer adhesives, other adhesives such as solder pastes can also be deposited with the method of the present invention, thereby to facilitate the more precise deposition of solder pastes with finer particles for forming finer features than are obtainable with conventional methods and to form higher solder bump columns than may be achievable with conventional methods. Preferred solder pastes of fine solder powders include both leaded and lead-free solder alloys that reflow at temperatures below 400° C. On the other hand, the adhesives deposited according to the present invention need not be conductive adhesives, but may be, for example, any suitable adhesive. In addition, the features deposited need not be square, rectangular or circular bumps, but may be, for example, straight, curved or free-form lines or areas.

In addition, while the word "mask" is used herein, it is intended that "mask" include masks, which are placed into contact with the substrate, as well as "stencils" which are suspended above and close to but not contacting the substrate, such as by a frame. Conventionally, stencils are pressed against the substrate by the implement, such as a squeegee or roller, applying the material to be deposited onto the substrate. In accordance with the present invention, however, a stencil mask placed proximate the substrate, i.e. not contacting the substrate, is attracted towards the substrate and is pulled into and held in close or intimate contact therewith by the magnetic force generated by the electromagnet 40, and the stencil does not move when the implement applying the material to be deposited is applied. When the electromagnet 40 is de-energized, the stencil returns to its original position above the substrate leaving the bumps of deposited material behind on the substrate. Similarly, the word "about" is intended to encompass tolerances and variability of manufacture, formulation, application, design and measurement as is known in the art.

In addition, apertures in compressible layers 138, 238, 338 on the underside of metal membranes 136, 236, 336, respectively, may be substantially larger than the corresponding apertures in metal membranes 136, 236, 336, and in fact may encompass a plurality of apertures in metal membrane 136, 236, 336, as is the case for enlarged apertures 142, 144 in compressible layer 138 of FIG. 4.

In the above examples, contact pads 12 of wafers that are aluminum bond pads 12 are passivated with nickel-gold layers, however, other non-oxidizing passivation such as nickel-palladium, may also be used. Where solder paste is to be deposited, the contact pad 12 metallization passivation must also be solderable. In addition, the conductive polymer adhesives of which conductive bumps are to be formed may contain various conductive fillers of which precious metal fillers are preferred. Suitable conductive adhesives include types PSS8154 and PSS8157 (gold-plated nickel flake filler), type PSS8159 (gold-plated copper flake filler), PSS9158 (gold flake filler), and PSS8156 (silver-palladium alloy flake filler), all of which are available from AI Technology. The preferred adhesives include thermoplastic and thermosetting polymers that have a substantial portion of their molecular structure being flexible and that exhibit a glass transition temperature Tg that is below ambient temperature. In addition, silver, gold, platinum and palladium particles and alloys thereof, or particles plated with such precious metals and alloys, may be employed to impart conductivity to the polymer adhesive. Resistivity as low as 0.1 ohm-cm can be attained. Similarly, the conductive filler particles may be flakes, spheres, rods and other shapes. Type PSS8159 is particularly cost effective when both high conductivity and avoidance of silver migration are taken into account, however, silver-particle-filled polymer conductive adhesives are more cost effective if a proper flexible adhesive underfill is employed to prevent silver migration.

The exemplary conductive adhesives described, other than solder pastes, are advantageous due to their intrinsic flexibility. These low modulus of elasticity conductive adhesives are able to reliably attach large semiconductor devices to various substrate materials because they accommodate the mismatch of the coefficients of thermal expansion (CTE) between the semiconductor chips (which exhibits CTE=3 ppm/° C.) and a ceramic substrate (CTE=7 ppm/° C.), an FR4 fiberglass laminate substrate (CTE=17 ppm/° C.), and a polymer built-up substrate (CTE=17–60 ppm/° C.).

The method of the present invention may be employed for depositing conductive adhesive onto semiconductor wafers and die that can be attached directly as flip chips onto electronic substrates or onto printed wiring circuit boards, and it may be employed for the deposition of conductive adhesive onto the electronic substrates, printed wiring circuit boards or flat panels of higher-level assemblies. It is noted that the method of the present invention is particularly useful for depositions onto large panels, such as single and multiple circuit boards fabricated on 18-inch or larger panels of printed circuit board substrate material such as FR4 laminate. The substrate as described herein may be a sheet of transfer film and the pattern of adhesive bumps deposited thereon may be then be transferred to the corresponding pattern of pads of a semiconductor substrate, printed wiring circuit board or other substrate.

The present invention is useful for flip chip devices, multiple flip chip devices, surface-mounted devices, jumpers and interconnecting wires, liquid crystal and other display devices, and other electronic and non-electronic devices.

What is claimed is:

1. A method for forming a pattern of adhesive on a substrate comprising:

obtaining a substrate having a pattern of sites thereon on which adhesive is to be deposited;

obtaining a magnetic mask having a pattern of apertures therethrough corresponding to the pattern of sites, wherein the magnetic mask includes a thin metal membrane and a layer of compressible material having a surface energy less than about 50 dyne/cm formed on at least one side of the thin metal membrane, one of the thin metal membrane and the compressible material having ferromagnetic properties, and wherein ones of the apertures in the layer of compressible material are substantially larger than corresponding ones of the apertures in the thin metal membrane;

positioning the substrate and the magnetic mask proximate each other with the compressible layer against the substrate so that the pattern of sites and the pattern of apertures correspond;

controllably energizing an electromagnet to generate a magnetic field to hold the substrate and the compressible layer of the magnetic mask in close contact;

applying adhesive onto the pattern of sites of the substrate through the apertures of the magnetic mask;

controllably de-energizing the electromagnet; and removing the magnetic mask to leave the adhesive on the pattern of sites on the substrate.

2. The method of claim 1 wherein said obtaining a magnetic mask includes obtaining a thin metal membrane of ferromagnetic material, wherein the ferromagnetic material is selected from the group consisting of steel, carbon steel, magnetic stainless steel, nickel alloy, iron alloy, polymeric film loaded with fine ferromagnetic particles, and combinations and laminations thereof.

3. The method of claim 1 wherein said obtaining a magnetic mask includes obtaining a thin metal membrane and forming a layer of compressible polymer filled with fine ferromagnetic particles on at least one surface of the thin metal membrane.

4. The method of claim 1 wherein said obtaining a magnetic mask includes forming the pattern of apertures by at least one of photo-etching, laser machining, electroforming, die cutting and screen emulsion.

5. The method of claim 1 wherein said obtaining a substrate includes one of:
   (a) obtaining a semiconductor wafer having a plurality of electrical circuits formed therein, each of the electrical circuits having contact pads that are included in the pattern of sites; and
   (b) obtaining a printed wiring circuit board having an electrical circuit wiring pattern thereon, wherein the electrical circuit wiring pattern has contact pads that are included in the pattern of sites.

6. The method of claim 1,
   wherein the magnetic mask has relational alignment holes in known predetermined position with respect to the pattern of apertures,
   wherein the substrate has corresponding relational alignment holes in the same known predetermined position with respect to the pattern of sites, and
   wherein positioning the substrate and the magnetic mask includes aligning at least two relational alignment holes on the magnetic mask with two corresponding relational alignment holes on the substrate.

7. The method of claim 6 wherein said aligning at least two relational alignment holes includes inserting respective alignment pins through each respective aligned pair of corresponding relational alignment holes of the magnetic mask and the substrate.

8. The method of claim 1 wherein said controllably energizing the electromagnet includes gradually increasing an electrical current applied to an electrical coil of the electromagnet to a first value prior to said positioning the substrate and the magnetic mask, and then gradually increasing the electrical current to a second substantially greater value.

9. The method of claim 8 wherein the second substantially greater value is sufficient to generate about 10 psi of pressure between the substrate and the magnetic mask.

10. The method of claim 1 wherein said applying adhesive includes one of:
    applying a solder paste,
    applying a flexible polymer adhesive, and
    applying a flexible polymer adhesive filled with sufficient electrically-conductive particles to render the flexible polymer adhesive conductive.

11. The method of claim 10 wherein the flexible polymer adhesive is selected from the group consisting of thermoplastic resins and thermosetting resins.

12. The method of claim 10 wherein the electrically-conductive particles are selected from the group consisting of gold, silver, platinum, palladium, alloys thereof, and coatings thereof on a base material.

13. The method of claim 1 further comprising attaching the substrate to a device substrate having a pattern of sites thereon corresponding to the pattern of sites on the substrate, wherein the corresponding sites of the respective patterns of sites are aligned and are joined by the adhesive.

14. The method of claim 13 wherein said attaching the substrate includes at least one of:
    heating the substrate and the device substrate, and
    pressing the substrate and the device substrate together.

15. The method of claim 1 wherein the pattern of sites have a pitch of less than 300 microns.

16. The method of claim 1 wherein the pattern of sites have a pitch of less than 100 microns.

17. The method of claim 1 wherein at least one of the apertures has a width dimension of less than 300 microns.

18. The method of claim 1 wherein at least one of the apertures has a width dimension of less than 100 microns.

19. A method for forming a pattern of adhesive on a substrate comprising:
    obtaining a substrate having a pattern of sites thereon on which adhesive is to be deposited;
    obtaining a magnetic mask having a pattern of apertures therethrough corresponding to the pattern of sites, wherein the magnetic mask includes a thin metal membrane and a layer of compressible material having a surface energy less than about 50 dyne/cm formed on at least one side of the thin metal membrane, one of the thin metal membrane and the compressible material having ferromagnetic properties, wherein said obtaining a magnetic mask includes:
        obtaining the thin metal membrane having the pattern of apertures therein, and
        forming the layer of compressible material on at least one surface of the thin sheet of metal material,
        wherein the apertures in the layer of compressible material are substantially larger than corresponding ones of the apertures in the thin metal membrane;
    positioning the substrate and the magnetic mask proximate each other with the compressible layer against the substrate so that the pattern of sites and the pattern of apertures correspond;
    controllably energizing an electromagnet to generate a magnetic field to hold the substrate and the compressible layer of the magnetic mask in close contact;
    applying adhesive onto the pattern of sites of the substrate through the apertures of the magnetic mask;
    controllably de-energizing the electromagnet; and
    removing the magnetic mask to leave the adhesive on the pattern of sites on the substrate.

20. A method for forming a pattern of adhesive on a substrate comprising:
    obtaining a substrate having a pattern of sites thereon on which adhesive is to be deposited;
    obtaining a magnetic mask having a pattern of apertures therethrough corresponding to the pattern of sites, wherein the magnetic mask includes a thin metal membrane and a layer of compressible material having a surface energy less than about 50 dyne/cm formed on at least one side of the thin metal membrane, one of the thin metal membrane and the compressible material having ferromagnetic properties;
    wherein at least one of the apertures in the layer of compressible material encompasses a plurality of ones of the apertures in the thin sheet of metal material;
    positioning the substrate and the magnetic mask proximate each other with the compressible layer against the substrate so that the pattern of sites and the pattern of apertures correspond;
    controllably energizing an electromagnet to generate a magnetic field to hold the substrate and the compressible layer of the magnetic mask in close contact;
    applying adhesive onto the pattern of sites of the substrate through the apertures of the magnetic mask;
    controllably de-energizing the electromagnet; and removing the magnetic mask to leave the adhesive on the pattern of sites on the substrate.

21. A method for forming a pattern of adhesive on a substrate comprising:

obtaining a substrate having a pattern of sites thereon on which adhesive is to be deposited;

obtaining a magnetic mask having a pattern of apertures therethrough corresponding to the pattern of sites, wherein ones of the apertures of the magnetic mask are substantially larger at a first end than at an other end thereof;

placing the substrate and the magnetic mask proximate each other with the larger first end of the ones of the apertures near the substrate so that the pattern of sites and the pattern of apertures correspond;

after said placing, applying a controlled electrical current to controllably energize an electromagnet to provide a first magnetic field strength sufficient to conform the magnetic mask to the substrate, wherein said applying a controlled electrical current includes gradually increasing the electrical current to a first value corresponding to the first magnetic field strength;

then aligning the substrate and the magnetic mask so that the pattern of sites and the pattern of apertures correspond;

then gradually increasing the electrical current applied to the electromagnet to a second substantially greater value to provide a second magnetic field strength substantially greater than the first magnetic field strength and sufficient to hold the magnetic mask and the substrate in close contact;

then, applying adhesive onto the pattern of sites of the substrate through the apertures of the magnetic mask;

controllably de-energizing the electromagnet by gradually decreasing the electrical current applied to the electromagnet; and removing the magnetic mask from the substrate to leave the adhesive on the pattern of sites on the substrate.

22. The method of claim 21 wherein the magnetic mask includes a thin metal membrane and a layer of compressible material having a surface energy less than about 50 dyne/cm formed on at least one side of the thin metal membrane, one of the thin metal membrane and the compressible material having ferromagnetic properties.

23. The method of claim 21 wherein said obtaining a magnetic mask includes obtaining a thin metal membrane of ferromagnetic material, wherein the ferromagnetic material is selected from the group consisting of steel, carbon steel, magnetic stainless steel, nickel alloy, iron alloy, polymeric film loaded with fine ferromagnetic particles, and combinations and laminations thereof.

24. The method of claim 21 wherein said obtaining a magnetic mask includes obtaining a thin metal membrane and forming a layer of compressible polymer filled with fine ferromagnetic particles on at least one surface of the thin metal membrane.

25. The method of claim 21 wherein said obtaining a magnetic mask includes forming the pattern of apertures by at least one of photo-etching, laser machining, electroforming, die cutting and screen emulsion.

26. The method of claim 21 wherein said obtaining a substrate includes one of:

(a) obtaining a semiconductor wafer having a plurality of electrical circuits formed therein, each of the electrical circuits having contact pads that are included in the pattern of sites; and (b) obtaining a printed wiring circuit board having an electrical circuit wiring pattern thereon, wherein the electrical circuit wiring pattern has contact pads that are included in the pattern of sites.

27. The method of claim 21, wherein the magnetic mask has relational alignment holes in known predetermined position with respect to the pattern of apertures, wherein the substrate has corresponding relational alignment holes in the same known predetermined position with respect to the pattern of sites, and wherein placing the substrate and the magnetic mask includes aligning at least two relational alignment holes on the magnetic mask with two corresponding relational alignment holes on the substrate.

28. The method of claim 27 wherein said aligning at least two relational alignment holes includes inserting respective alignment pins through each respective aligned pair of corresponding relational alignment holes of the magnetic mask and the substrate.

29. The method of claim 21 wherein the second substantially greater value is sufficient to generate about 10 psi of pressure between the substrate and the magnetic mask.

30. The method of claim 21 wherein said applying adhesive includes one of:

applying a solder paste, applying a flexible polymer adhesive, and applying a flexible polymer adhesive filled with sufficient electrically-conductive particles to render the flexible polymer adhesive conductive.

31. The method of claim 30 wherein the flexible polymer adhesive is selected from the group consisting of thermoplastic resins and thermosetting resins.

32. The method of claim 30 wherein the electrically-conductive particles are selected from the group consisting of gold, silver, platinum, palladium, alloys thereof, and coatings thereof on a base material.

33. The method of claim 21 further comprising attaching the substrate to a device substrate having a pattern of sites thereon corresponding to the pattern of sites on the substrate, wherein the corresponding sites of the respective patterns of sites are aligned and are joined by the adhesive.

34. The method of claim 33 wherein said attaching the substrate includes at least one of:

heating the substrate and the device substrate, and pressing the substrate and the device substrate together.

35. A method for forming a pattern of adhesive on a substrate comprising:

obtaining a substrate having a pattern of sites thereon on which adhesive is to be deposited;

obtaining a magnetic mask having a pattern of apertures therethrough corresponding to the pattern of sites, wherein said obtaining a magnetic mask includes:

obtaining a thin metal membrane having the pattern of apertures therein, and forming a layer of compressible material on at least one surface of the thin sheet of metal material, wherein the apertures in the layer of compressible material are substantially larger than corresponding ones of the apertures in the thin metal membrane;

placing the substrate and the magnetic mask proximate each other with the larger end of the apertures near the substrate so that the pattern of sites and the pattern of apertures correspond;

after said placing, applying a controlled electrical current to controllably energize an electromagnet to provide a first magnetic field strength sufficient to conform the magnetic mask to the substrate, wherein said applying a controlled electrical current includes gradually increasing the electrical current to a first value corresponding to the first magnetic field strength;

then aligning the substrate and the magnetic mask so that the pattern of sites and the pattern of apertures correspond;

then gradually increasing the electrical current applied to the electromagnet to a second substantially greater value to provide a second magnetic field strength substantially greater than the first magnetic field strength and sufficient to hold the magnetic mask and the substrate in close contact;

then, applying adhesive onto the pattern of sites of the substrate through the apertures of the magnetic mask;

controllably de-energizing the electromagnet by gradually decreasing the electrical current applied to the electromagnet; and removing the magnetic mask from the substrate to leave the adhesive on the pattern of sites on the substrate.

36. A method for forming a pattern of adhesive on a substrate comprising:

obtaining a substrate having a pattern of sites thereon on which adhesive is to be deposited;

obtaining a magnetic mask having a pattern of apertures therethrough corresponding to the pattern of sites, the magnetic mask including a thin metal membrane and a layer of compressible material on at least one layer thereof, wherein apertures in the layer of compressible material are substantially larger than corresponding ones of apertures in the thin metal membrane, and wherein at least one of the apertures in the layer of compressible material encompasses a plurality of ones of the apertures in the thin metal membrane;

placing the substrate and the magnetic mask proximate each other so that the pattern of sites and the pattern of apertures correspond;

after said placing, applying a controlled electrical current to controllably energize an electromagnet to provide a first magnetic field strength sufficient to conform the magnetic mask to the substrate, wherein said applying a controlled electrical current includes gradually increasing the electrical current to a first value corresponding to the first magnetic field strength;

then aligning the substrate and the magnetic mask so that the pattern of sites and the pattern of apertures correspond;

then gradually increasing the electrical current applied to the electromagnet to a second substantially greater value to provide a second magnetic field strength substantially greater than the first magnetic field strength and sufficient to hold the magnetic mask and the substrate in close contact;

then, applying adhesive onto the pattern of sites of the substrate through the apertures of the magnetic mask;

controllably de-energizing the electromagnet by gradually decreasing the electrical current applied to the electromagnet; and removing the magnetic mask from the substrate to leave the adhesive on the pattern of sites on the substrate.

* * * * *